(12) United States Patent
Lindstrom et al.

(10) Patent No.: US 8,078,129 B2
(45) Date of Patent: Dec. 13, 2011

(54) SYSTEMS AND METHOD FOR A HIGHLY INTEGRATED MULTI-MODE TUNER

(75) Inventors: Mats Lindstrom, San Diego, CA (US); Abbolreza Shafie, San Diego, CA (US)

(73) Assignee: NXP B.V., Eindhoven (NL)

( * ) Notice: Subject to any disclaimer, the term of this patent is extended or adjusted under 35 U.S.C. 154(b) by 455 days.

(21) Appl. No.: 12/391,020

(22) Filed: Feb. 23, 2009

(65) Prior Publication Data
US 2009/0156145 A1    Jun. 18, 2009

Related U.S. Application Data

(62) Division of application No. 11/244,568, filed on Oct. 6, 2005, now Pat. No. 7,515,888.

(51) Int. Cl.
*H04B 1/16* (2006.01)

(52) U.S. Cl. .......................... 455/266; 455/296
(58) Field of Classification Search ............... 455/200.1, 455/226.1, 254, 266, 295, 296, 307; 375/232, 375/349, 351
See application file for complete search history.

(56) References Cited

U.S. PATENT DOCUMENTS

| | | | | |
|---|---|---|---|---|
| 5,369,470 A | * | 11/1994 | Hansen | 455/296 |
| 6,426,780 B1 | * | 7/2002 | Limberg et al. | 455/307 |
| 6,445,735 B1 | * | 9/2002 | Whikehart | 375/232 |
| 2007/0281653 A1 | * | 12/2007 | Haub | 455/266 |

* cited by examiner

*Primary Examiner* — Thanh Le

(57) ABSTRACT

A method and apparatus for a tuner for adjusting the receiver bandwidth based on adjacent channel interference and group delay distortion.

5 Claims, 9 Drawing Sheets

SYSTEMS AND METHOD FOR A HIGHLY INTEGRATED MULTI-MODE TUNER

BACKGROUND

1. Field of the Invention

The invention relates generally to tuners and more specifically to a highly integrated tuner that can be configured for multiple mode operation and that can be highly integrated.

2. Background of the Invention

A key component in any television or set top box is the tuner. The tuner is the component that allows the television or set top box to tune into, or select, different channels. More generally, a tuner is a key component in any type of receiver that is configured to receive multiple channels. Thus, the tuner is configured to tune in the desired channel, while blocking or filtering signals on unwanted channels. The tuner is often also configured to filter received signals and block, or attenuate unwanted noise, or interference signals.

Clearly, the performance of the tuner will effect the overall performance of the television, or set top box. For example, if the tuner does not do a good job of blocking, or attenuating unwanted signals, or signals on unwanted channels, then the television, or set top box will not have "good reception." Good reception is a clear product differentiator, especially with the advent of high definition television, which has raised the stakes, and profile with regard to reception quality for video consumer electronics. The tuner is often also one of the most expensive components in a television or set top box. Accordingly, tuner design is often driven by the need to improve performance, while reducing the cost. Reduced cost is often tied to reduced size, and increased component integration.

Much has been done in the area of tuner integration and increased performance; however, conventional tuners still suffer performance and integration limitations that effect the size, cost, and capability of conventional tuners, and therefore the products they ultimately go into.

FIG. 1 is a diagram illustrating a conventional receiver 100. It will be understood that a conventional receiver can comprise additional components beyond those illustrated. Such components are well known, however, and not relevant to the following descriptions and are therefore omitted for the sake of brevity. Receiver 100 can, for example, be included in a cable or terrestrial television or set top box. A receiver 100 is often interfaced directly with an antenna or cable input from which a multi-channel signal is received.

Conventional receivers can be configured to operate in accordance with one of the various digital and analog standards for both cable and terrestrial applications. The applicable standard defines the overall bandwidth of the system, and the channel scheme. In other words, each system is allocated a certain bandwidth. That bandwidth is then divided into a certain number of channels. Each channel is then defined by channel bandwidth and by a carrier frequency, or plurality of carrier frequencies.

For example, in the standard broadcast terrestrial system channels 2-13 are in the VHF band that extends from 54 MHz to 216 MHz and channels 14-83 reside in the UHF band that extends from 410 MHz to 890 MHz. The UHF band and VHF band are in the Radio Frequency (RF) portion of the frequency spectrum. Each channel in the standard broadcast terrestrial system has a 6 MHz bandwidth, i.e., the VHF and UHF bands are divided into a plurality of 6 MHz channels. Each channel is then associated with three carriers: one for video data, one for color data, and one for audio data. The video carrier is located at 1.25 MHz above the lower band edge, the color carrier is located 3.58 MHz above the video carrier, and the audio carrier is located 4.5 MHz above the video carrier.

A conventional receiver, such as receiver 100, often comprises several components including a front end tuner 102, a processor 104, as well as several other components including, for example, external filters 114 and 120. Tuner 102 typically comprises three stages: an RF stage 122, and Intermediate Frequency (IF) stage 124, and a low IF stage 126. RF stage 122 is configured to receive RF signals, e.g., in the VHF and UHF bands, and convert the RF signals to an IF signal for further processing. Many conventional tuners, such as tuner 102, are configured to actually up-convert the RF signal to a higher IF in order to reduce the amount of filtering needed at the input to tuner 102. IF section 124 can then be configured to convert the IF signal down to a lower IF signal for further processing by processor 104. Processor 104 can, for example, be configured to demodulate the low IF signal in order to recover the actual data, e.g., the video, color, and audio data. In other implementations, the demodulator can be separate from processor 104.

In RF section 122, the received signal is first filtered using a band pass filter 106, which is configured to filter out, or attenuate unwanted signals outside a desired bandwidth, or range of channels. The filtered signal is then often passed to a Low Noise Amplifier (LNA) 108. LNA 108 aids in the reception of very low power signals by amplifying the low power signal while adding very little noise itself to the amplified signals.

The amplified signal is then typically amplified again by an Automatic Gain Control (AGC) amplifier 110. The gain of AGC 110 can, for example, be controlled by processor 104. The signal is then converted to an IF signal by mixer 112. Mixer 112 is configured to combine the received RF signal with a Local Oscillator (LO) signal in a manner design to produce the desired IF signal. The LO signal is tuned to the proper frequency based on the desired channel.

The IF signal is then filtered by filter 114 in IF section 124. Filter 114 is typically a Surface Acoustic Wave (SAW) filter. While SAW filters provide many advantages, their size and construction often prevent integration with other components, e.g., in tuner 102. The filtered signal is then mixed to a lower IF by mixer 118, which combines the IF signal with an IF LO signal. The IF LO signal is tuned to the proper frequency based on the desired channel.

The low IF signal is then filtered by filter 120 to remove unwanted image signals in low IF section 126 and ultimately passed to processor 104. Again, filter 120 is often an external SAW filter. The signal is then amplified by AGC 116.

As mentioned, conventional tuners, such as tuner 102, suffer several limitations. For example, conventional tuners often have an external SAW filter in the IF section, or low IF section that is application and standard specific. In other words, the bandwidth of, e.g., filter 120 is defined based on the standard that tuner 100 is configured to implement. For example, in the U.S. the TV and digital cable channels are 6 MHz apart so the appropriate SAW filter would be a 6 MHz filter. In the Europe, the TV and digital cable channels are 8 MHz apart so that the appropriate SAW filter is 8 MHz. As a result, a tuner that is designed to work in the U.S., with a 6 MHz SAW filter, will not work as a tuner designed to work in Europe and vise versa. As a result, tuner manufacturers have to build different TV tuners depending on the end market and cannot build a single off the shelf tuner for use anywhere in the world.

Additionally, in conventional tuners, the RF and IF AGCs, e.g., AGCs 110 and 112 respectively, are used to adjust the power level of the low IF signal to a fixed value, regardless of the power level for the signal at the input to the tuner. Conventional tuners use what is called a take over point algorithm to adjust the RF AGC and IF AGC of the tuner over the dynamic range of corresponding standard. Although this technique is simple to implement, it lacks flexibility and can often result in less than optimum performance under various and different RF environments, especially in terrestrial applications.

For example, the take over point technique assumes a fixed and predefined RF condition for the tuner and then optimizes the RF and IF AGC settings for this assumed condition. Often, the assumed condition is a worse case condition in order to ensure that the receiver will work under such a worse case condition. If the tuner experiences a different RF condition, however, then the assumed conditions will obviously be incorrect. This can actually have an adverse effect on performance, since the AGC settings will not be optimized for the actual conditions. In the case where the assumed condition for the AGCs take over point is a worse case condition, the tuner will actually be experiencing better conditions most of the time. As a result, a conventional tuner's performance will not be optimized under most conditions, making it high likely that the Signal-to-Noise Ratio (SNR) at the output of the tuner is not what the tuner could deliver if the take over point could have been adjusted for the actual conditions. The inability to adjust the take-over-point in conventional tuners can have a particularly adverse effect in terrestrial applications where the RF environment varies from location to location and time to time.

SUMMARY

A tuner that includes dynamic adjustment of the IF and RF AGC values under actual operating conditions enables improved SNR and tuner optimization under a wider range of operating conditions. The tuner is configured to measure the SNR during operation and then adjust the IF and RF AGC values in order to optimize the SNR.

In another aspect, the tuner also includes an integrated IF band pass filter, the bandwidth of which can be programmed for different standards.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION OF THE PREFERRED EMBODIMENTS

Figure 1:
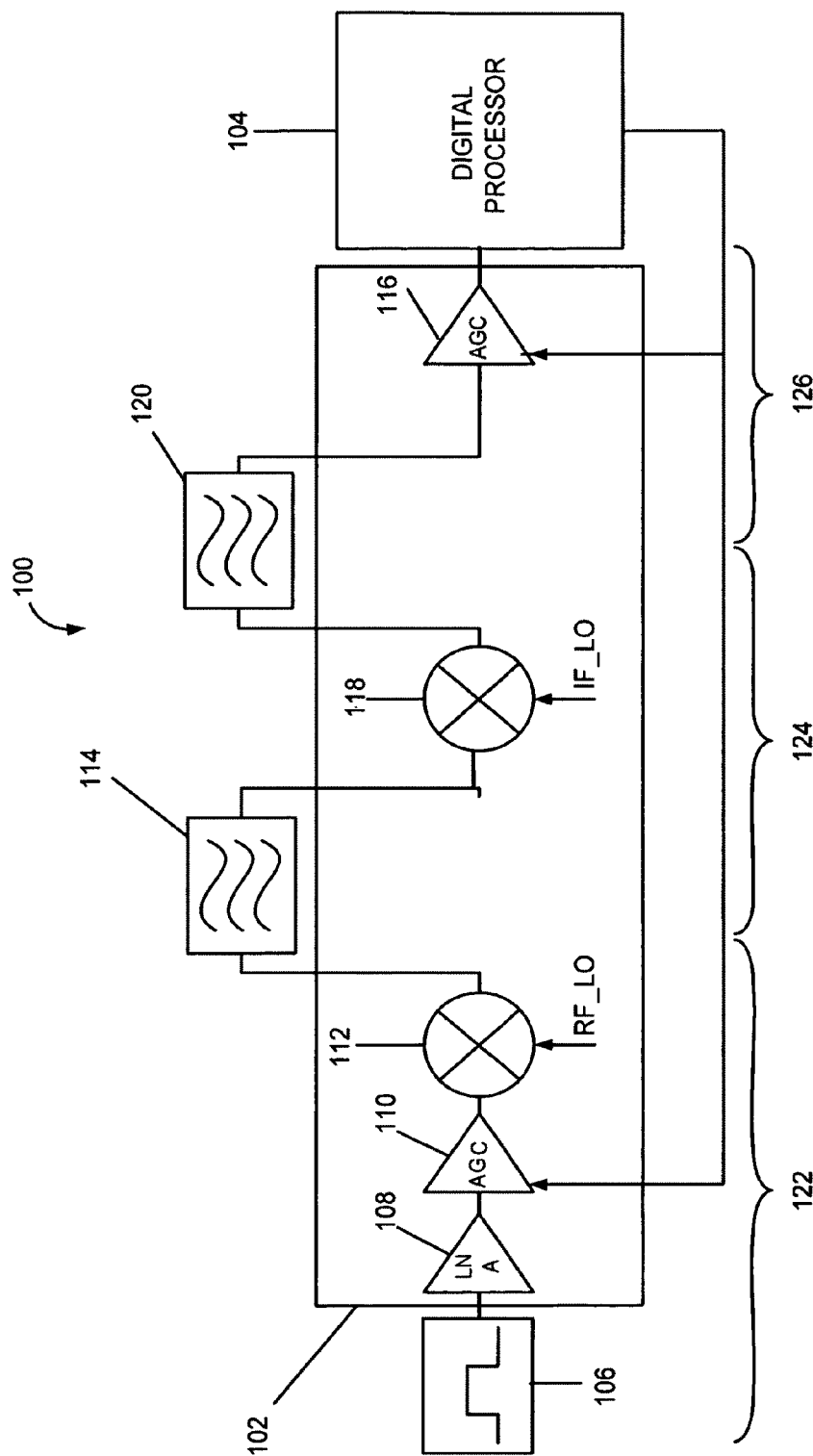
FIG. 1 is a diagram illustrating an exemplary conventional tuner.
Figure 2:
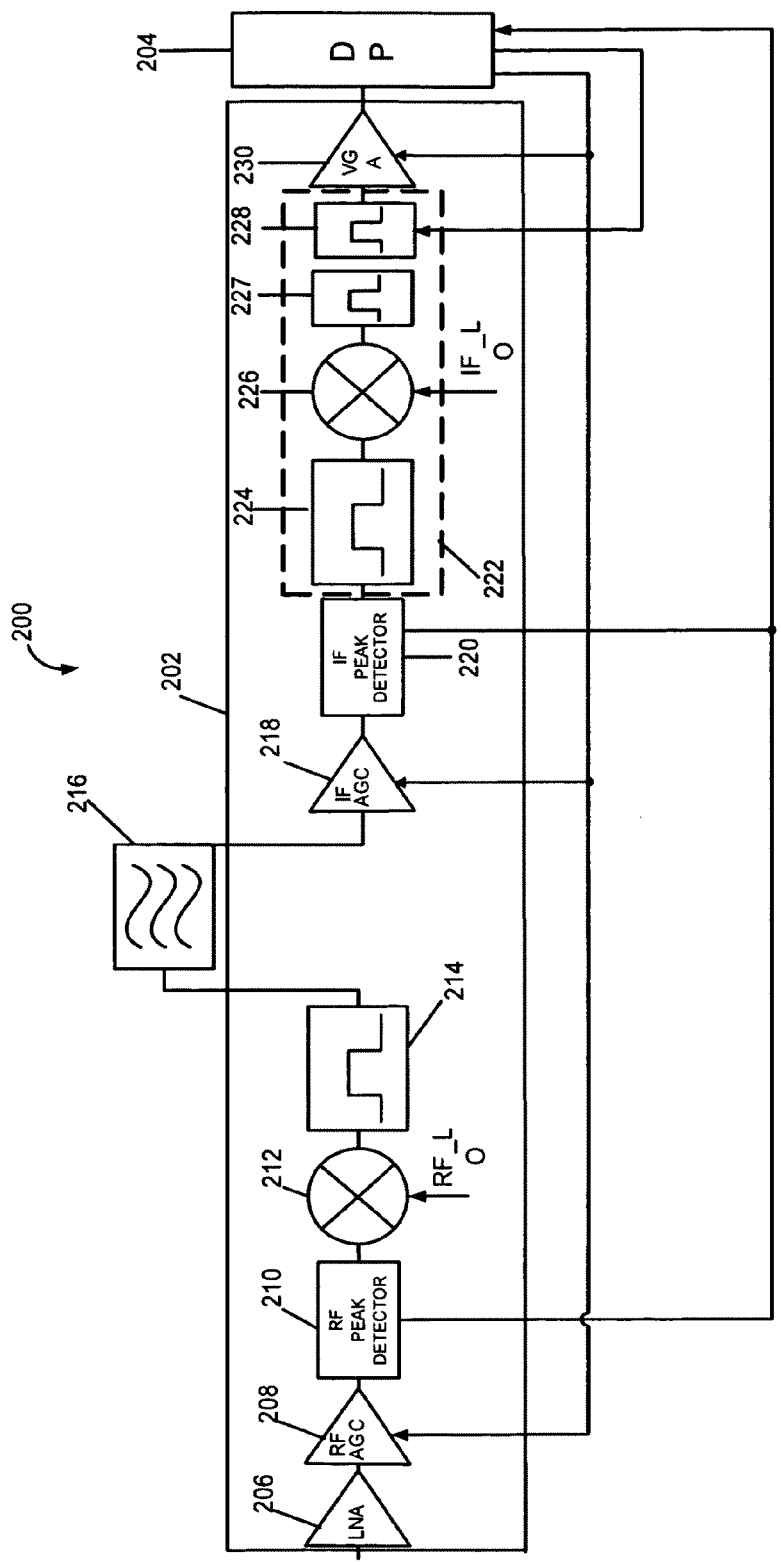
FIG. 2 is a diagram illustrating an example tuner configured in accordance with one embodiment.

FIG. 2 is a diagram illustrating an example receiver 200 configured in accordance with the systems and methods described herein. In the embodiments described herein, it will be assumed that receiver 200 is part of a television or set top box tuner; however, it will be apparent that receiver 200 can be a receiver designed for other types of applications as well. Thus, the embodiment of FIG. 2 and the descriptions that follow should not be seen as limiting the embodiment herein to a specific application or architecture.

Receiver 200 comprises a tuner 202, external filter 216 and processor 204. Signals received by receiver 200 can first be amplified by LNA 206 and then by RF AGC 208, which is under the control of processor 204 as described below. The amplified signal is then sent to peak detector 210, the operation of which is also described in more detail below. After peak detector 210, the signal is mixed with an RF LO signal in mixer 212 and converter to an IF signal, which can then be filtered via filters 214 and 216. The filtered signal can then be amplified by IF AGC 218, under the control of processor 204 as described below. The amplified signal can then be sent to a second peak detector 220.

After peak detector 220, the signal can then be converted to a low IF signal via mixer 226. In certain embodiments, receiver 202 can comprise an image rejection block 222 that can include mixer 226. The operation of image rejection block 222 will be discussed in more detail below. The low IF signal can then be amplified by Variable Gain Amplifier (VGA) 230, before being sent to processor 204. As explained below, processor 204 can comprise the demodulator need to convert the low IF signal to a baseband signal for further processing by processor 204.

As mentioned, there are essentially three AGC within receiver 200, namely, RF AGC 208, IF AGC 218, and VGA 230. These AGCs can be controlled, in certain embodiments, via 3-wire control interface from digital processor 204. In other embodiments, the AGCs can be controlled via 2-wire control interface digital processor 204. In such embodiments, IF AGC 218 and VGA 230 can be controlled with the same external control voltage. Alternatively, IF AGC 218 or VGA 230 can be fixed to at a predefined value, e.g., with 4 options, depending on whether VGA 230 is controlled externally, and vise versa. Or, in another embodiment, both IF AGC and VGA can be fixed to a predefined value with four options via an 12C programming line.

Unlike conventional receivers, processor 204 can be configured to implement a cognitive algorithm designed to optimize the SNR performance for the actual RF environment being experienced, as opposed to some assumed condition, such as a worse case condition. This can be effective for improving performance, particularly in terrestrial applications where the RF environment and the ratio of undesired signals to desired signal is often unknown and changes from location to location and/or time to time. In general, the idea is to optimize the voltage values of RF AGC 208 and IF AGC 218 without saturating or compressing the following mixers, 212 and/or 226, respectively, so that the SNR at the output of receiver 200 is maximized.

It is desirable to adjust the RF and IF AGC voltage values, and as a result the tuner gain settings, so that the IF output level is at a given Full Scale (FS) input to the demodulator, regardless of the RF input level. In conventional tuners using a conventional take over point algorithm, when the RF input signals is very close to noise floor of the receiver, the demodulator adjusts the IF AGC voltage value, while maintaining the RF AGC voltage at a constant, predefined value. As the RF input signal level increases, the demodulator continues to adjust the IF AGC until a threshold, or predefined IF AGC voltage, which is often referred to as the RF AGC take over point, is reached. The RF AGC take over point is typically defined by determining a RF AGC attenuation level that ensures receiver front end will not be saturated for a given RF input level.

Now, by increasing the RF input signal level even more, once the RF AGC take over point is reached, then the demodulator will start to adjust the RF AGC voltage, while maintaining a constant IF AGC voltage in order to achieve the desired IF output level. Thus, the only degree of freedom for adjusting the output SNR of the tuner is the RF AGC take over point. But as mentioned, this value is typically based on an assumed worse case condition and result in less than ultimate performance under many operating conditions. Thus, the cognitive algorithm implemented in accordance with the systems and methods described herein can result in better optimization over a broader range of operating conditions.

In the embodiment of FIG. 2, receiver 200 is a heterodyne receiver; however, it will be apparent that the systems and methods described herein can apply to receivers and/or tuners that are heterodyne or homodyne in architecture. As a result, the number of AGCs present as well as the number and type of receiver stages may vary, but a cognitive algorithm used to optimize the performance in accordance with the systems and methods described herein can still be applied. In addition to RF AGC 208 and IF AGC 218, tuner 202 also includes VGA 230. In other words, there can essentially be three AGCs under control of processor 204 implementing the cognitive algorithm described below. The cognitive algorithm is designed to control RF AGC such that the SNR is maximized, but while also ensuring that RF mixer 212 is not saturated. Similarly, IF AGC 218 is controlled to also ensure that IF mixer 226 is not saturated.

Figure 5:
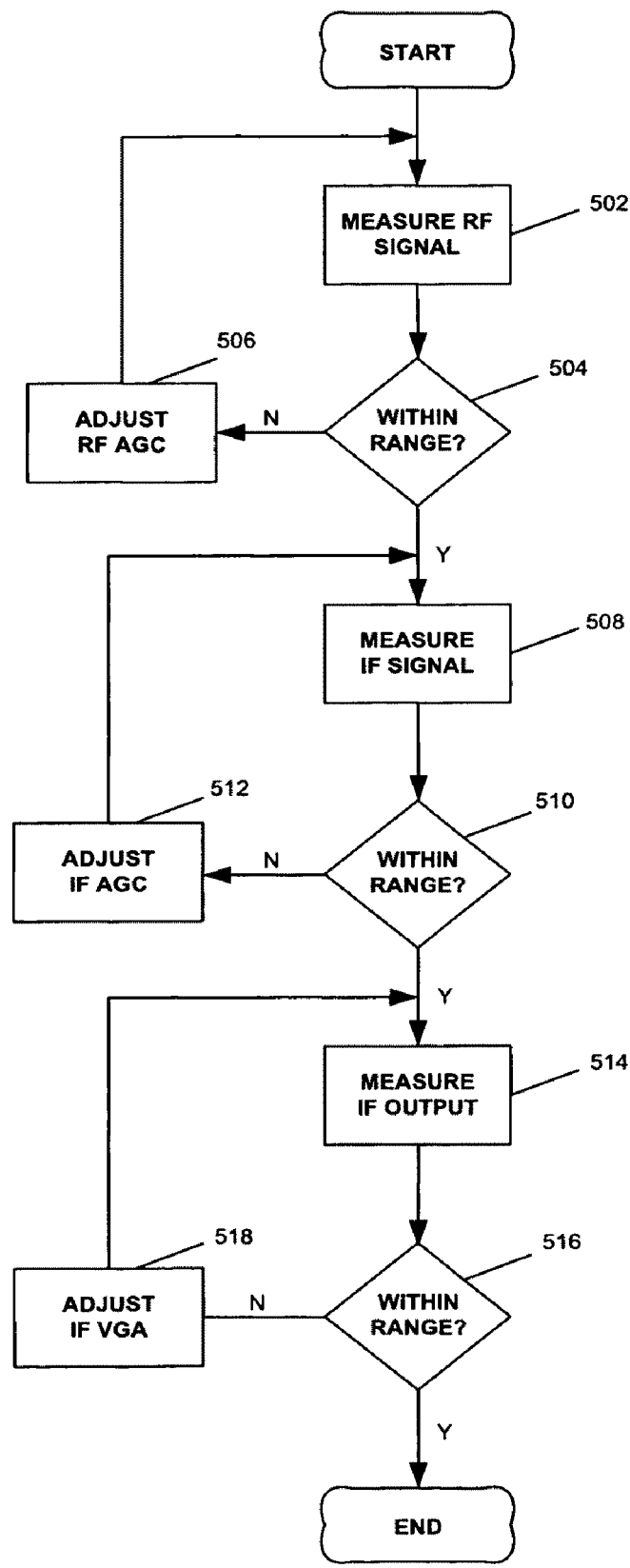
FIG. 5 is a flow chart illustrating an example process for optimizing the performance of the tuner of FIG. 2 in accordance with one embodiment.

FIG. 5 is a flow chart illustrating a high level embodiment of the cognitive algorithm described herein. The process of FIG. 5 can be implemented under the control of processor 204 in order to ensure SNR optimization at the output of the tuner/receiver. First, in step 502, the RF signal level can be measured, e.g., the peak power strength of the RF signals going into RF mixer 212 can be measured. In step 504, it can be determined whether the RF signal level is within a desirable operating range. If it is determined that the RF signal level is outside the desirable range in step 504, then the signal level can be adjusted in step 506, e.g., RF AGC 208 can be controlled so as to bring the RF signal level within the desirable range.

Once the RF signal is within the desirable range, then the IF signal level can be measured in step 508. For example, the peak power strength of the IF signal going into IF mixer 226 can be measured, e.g., via peak detector 220. In step 510, it can be determined whether the IF signal level is within a desirable operating range. If it is determined that the IF signal level is outside the desirable range in step 510, then the signal level can be adjusted in step 512, e.g., IF AGC 218 can be controlled so as to bring the IF signal level within the desirable range. Once the IF signal level is within the desirable range, then the IF output can be measure in step 514 and determination can be made in step 518 as to whether the IF output is at Full Scale. If it is not at full scale, then in step 516 the IF output can be adjusted, e.g., via IF VGA 230, in order to bring it to full scale.

In this manner, the mixers are not saturated but are operating with signals that are close to the highest level of signals that they can tolerate without distortion. As a result, the mixers should be at their optimum SNR performance settings, i.e., when optimum third order intercept point (IIP3) and Noise Figure (NF) are achieved simultaneously.

In the example of FIG. 2, peak detectors 210 and 220 are used to determine the peak power strength of signals going into the mixers. This has the advantage that now AGC adjustment can be based on operating conditions rather than some assumed, e.g., worse case scenario. In certain embodiments, RF peak detector 210 is a broadband and IF peak detector 220 can be as wide as the external SAW bandpass filter. For example, in one specific implementation, peak detectors 210 and 220 are 135 and 3-channels wide, respectively. In such instances, it will not be known whether the measured power is due to the desired signal alone or a combination of desired and undesired, e.g., adjacent channel signals. As a result, additional data is needed to determine the Undesired to Desired signal ratio (U/D) of the adjacent channels. Furthermore, since it is the output SNR that needs to be maximized, it can be preferable to have a SNR detector after tuner 202 configured to monitor the SNR of the signal at the output of tuner 202 after each adjustment of the AGCs in order to ensure the adjustments are having the desired effect.

Figure 3:
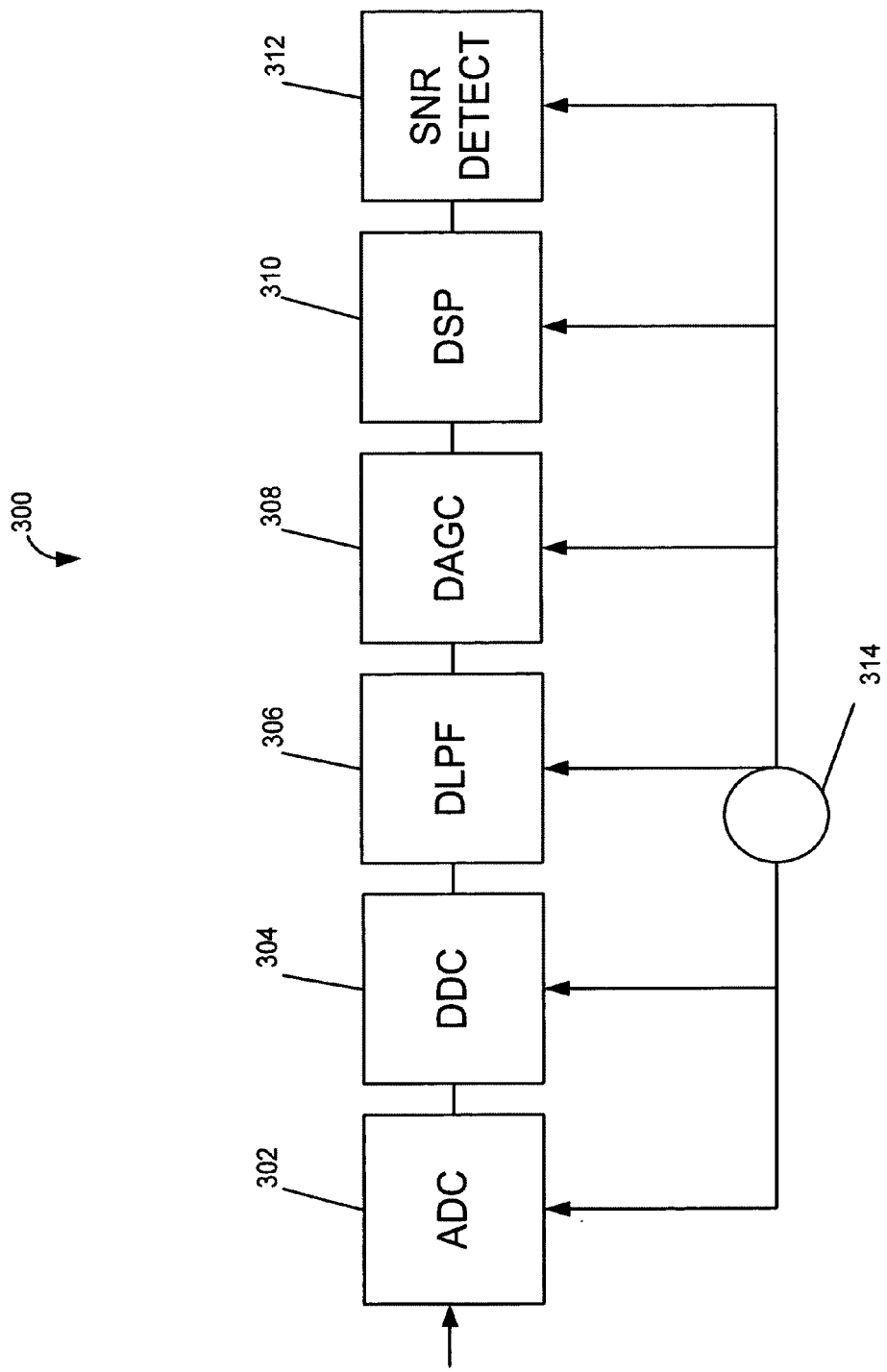
FIG. 3 is a diagram illustrating example functional block diagram of an analog and/or digital demodulator comprising a processor that can be included in the tuner of FIG. 3 in accordance with one embodiment.

The SNR detector just described can be included in processor 204, or the demodulator that follows tuner 202. FIG. 3 is a diagram illustrating functional blocks that can be included in a processor 204, or demodulator circuit, in accordance with one embodiment of the systems and methods described herein. It will be clear that such a processor or demodulator will include other blocks not shown here for the sake of brevity.

Processor 204, as illustrated in FIG. 3, can comprise an Analog-to-Digital Converter (ADC) 302, which can be configured to convert the low IF signal received from receiver 202 into a digital signal. The digital signal can then be down converted to a baseband digital signal, i.e., in embodiments where tuner 202 is configured to produce a low IF signal, in Digital Down Converter (DDC) 304. The down converted signal can then be filtered, e.g., via Digital Low Pass Filter (DLPF) 306. Processor 204 can also include a Digital Automatic Gain Control (DAGC) 308, the operation of which is described in more detail below, and Digital Signal Processing (DSP) block 310, which can include all other blocks not mentioned here but required for proper demodulation of the input signal. Processor 204 can also include a SNR detector 312 configured to sample the SNR of the input signal. Processor 204 can also comprise a common sampling clock 314.

In the embodiment of FIG. 2, RF peak detector 210 is after the RF AGC 208 and before mixer 212. In addition, an image rejection filter (not shown) can also follow peak detector 210, i.e., an image rejection filter can proceed mixer 212. Accordingly, there can be no selectivity before RF peak detector 210. In such situations, peak detector 210 will measure the peak power level of the broadband signals being received.

In addition, IF peak detector 220 follows IF AGC 218 but proceeds IF Mixer 226, and band stop filter 224 included in image rejection block 222. IF peak detector 220 also follows filter 216, which can be a narrow band pass filter, such as a SAW filter. In one embodiment, for example, the SAW filter is centered at 1220 MHz and is 3 channels wide. Thus, IF peak detector 220 measures the peak power level for the three channels centered at, e.g., 1220 MHz. In other words, peak detector 220 measures the power level for one desired channel and N±1 adjacent undesired channels.

DAGC 308 can be configured to provide a digital gain to the signal produced by DDC 304 in order to bring the desired signal to full scale. This digital gain can be equivalent to $$\left(\frac{U}{D}\right)_{N\pm1}$$

ratio, since only the residual of the N±1 channels can reach the ADC. Accordingly, the ratio of $$\left(\frac{U}{D}\right)_{N\pm1}$$

can be determined from the DAGC 308 whenever the gain is adjusted to bring the desired signal to full scale. The ratio of $$\left(\frac{U}{D}\right)$$

can then be used as described below.

In one embodiment, power level measurements from peak detectors 210 and 220 are used to control RF AGC 208, IF AGC 218, and/or VGA 230. For example, the peak detector measurements can be compared to threshold values. Depending on the results of the comparisons, the gain of the various AGCs can be adjusted to ensure that the SNR is optimized and that the mixers are not saturated. In one specific implementation for example, RF and IF peak detectors, 210 and 212 respectively, have four threshold levels. The thresholds can also be divided between two modes: a high power mode and a low power mode. For example, the following thresholds can be used:

TABLE 1

| Binary Assignment | RF Peak Detector | IF Peak Detector |
|---|---|---|
| 00 | 200 mVp | 100 mVp |
| 01 | 160 mVp | 70 mVp |
| 10 | 50 mVp | 10 mVp |
| 11 | 40 mVp | 7 mVp |

These values can be associated with a binary value as illustrated. The values can then be programmed, e.g., via I²C control lines in the descending voltage order as shown.

Figure 6:
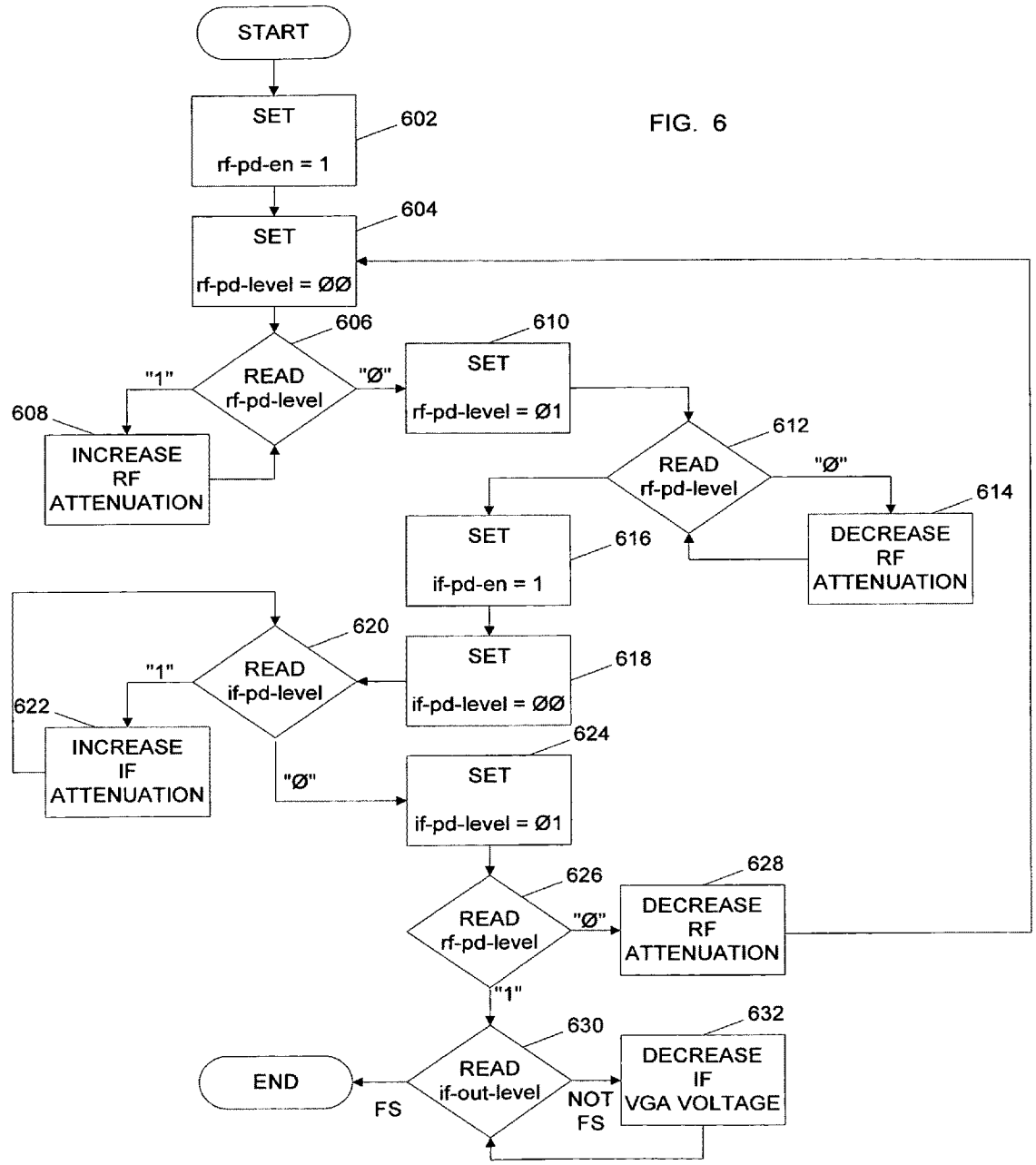
FIG. 6 is a flow chart illustrating an example method for controlling the gain of AGCs included in the tuner of FIG. 2.

FIG. 6 is a flow chart illustrating an example method for controlling the AGCs of tuner 202 in a high power mode in accordance with one embodiment of the systems and methods described herein. Several variables are used in the example of FIG. 6. These variables include "rf_pd_en," "rf_pd_level," "if_pd_en," "if_pd_level," "and if_out_level." The variable rf_pd_en can be used to enable the RF peak detector 210. Similarly, the variable if_pd_en can be used to enable IF peak detector 220. The variables rf_pd_level and if_pd_level can be used to store values associated with the levels determined using RF and IF peak detectors 210 and 220, respectively. The variable if_out_level can be used to store a value associated with the output of VGA 230.

With this in mind, the process of FIG. 6 can begin in step 602 with the setting of the variable rf_pd_en. For example, rf_pd_en can be set to "1" in order to enable the reading of RF peak detector 210. In step 604, rf_pd_lvel can then be set to "00," and in step 606, the actual RF level can be read. The RF level can be associated with binary values, such as "1" and "0." A "1" can indicate that the actual level is above the associated level, e.g., "00," while a "0" can indicate that the actual level is below the associated level, e.g., "00." Thus, in step 606, if the level is a "1," then in step 608, the RF attenuation can be increased, e.g., via control of RF AGC 208. If, on the other hand, the level is a "0" in step 606, then the variable rf_pd_level can be set to the next level, e.g., "01."

The actual RF level can then be read in step 612. This time, if the level is a "0," then the RF attenuation can be decreased in step 614. If on the other hand, the RF level is a "1," then if_pd_en can be set, e.g., to "1" in step 616, and if_pd_level can be set to "00" in step 618. The IF level can then be read in step 620. If the IF level is a "1" as determined in step 620, then the IF attenuation can be increased in step 622, e.g., via control of the IF AGC 202. If the IF level is a "0," then if_pd_-level can be set to "01" in step 624 and the RF level can be read again in step 626. If the RF level is a "0," then the RF attenuation can be decreased in step 628. If the RF level is a "1" as determined in step 626, then the IF output level can be read in step 630. If the IF output level is Full Scale (FS), then the process can end. If the IF output level is not FS, then the control voltage for VGA 230 can be decreased in step 632.

Figure 7:
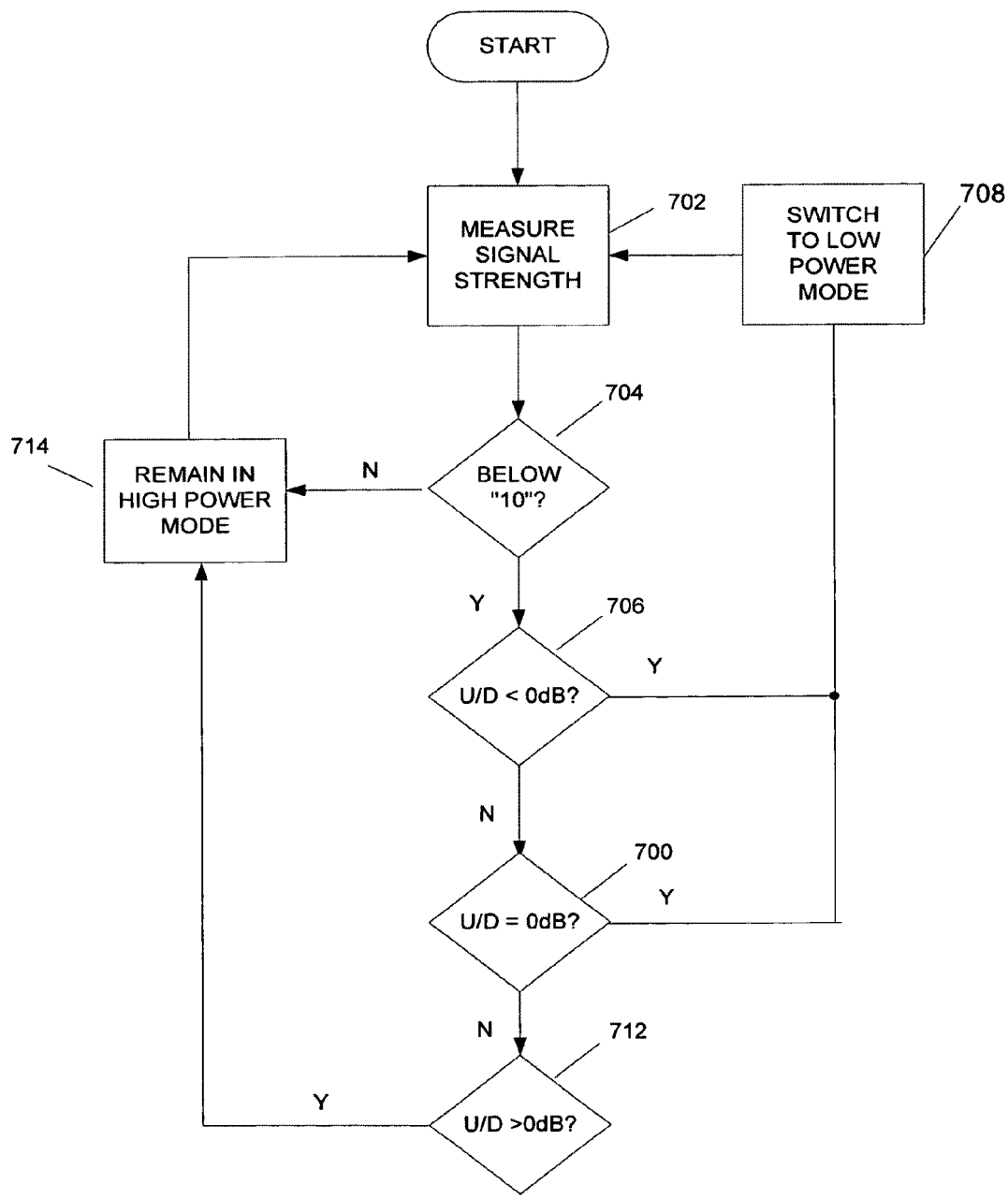
FIG. 7 is a flow chart illustrating an example method for switching between power modes when controlling the gain of AGCs included in the tuner of FIG. 2.

As mentioned above, a receiver/tuner configured to operate in accordance with the systems and methods described herein can be configured to operate in several power modes, where each mode has its own associated thresholds for operation and control of the AGCs. For example, in the embodiment described in relation to table 1, the tuner can have two modes of operation: a high power mode and a low power mode. The flow chart of FIG. 6 is illustrates example operation in a high power mode. FIG. 7 is a flow chart illustrating an example method for switching from high power mode to low power mode in accordance with one embodiment of the systems and methods described herein.

The high power mode can be when fully loaded input RF spectrum are expected to be handled by the tuner. The low power mode can be when the tuner is expected to handle weak, desired signals only. In certain embodiments, the switch between power modes can be allowed during the channel change. In order to switch to the low power mode, the tuner needs to ensure that input signal is "weak" and "desired" only. The weakness, or strength of the signal, can be measured, in step 702, by RF and IF peak detectors 210 and 212, respectively. In step 704, if it is determined that the measured signal power is below the "10" value, then the signal can be considered weak; however, the measured signal power may not be due entirely to the desired signal. In other words, some part of the measured signal power can be due to undesired signals.

After the digital low pass filtering by DLPF 306, DAGC 308 can be configured to adjust the digital gain to ensure the signal level is at full scale. The digital gain from DAGC 308 can be directly proportional to voltage ratio $$\left(\frac{U}{D}\right)_{N\pm1}.$$

Thus, the ratio $$\left(\frac{U}{D}\right)_{N\pm1}$$

can be determined in step 706, from DAGC 308.

Thus, if it is determined in step 706 that $$\left(\frac{U}{D}\right)_{N\pm1} < 0 \text{ dB},$$

then it can be determined in step 706 that there is no undesired signal component in the signal. Under this determined condition, the tuner can then be switched, in step 708 to the low power mode.

If it is determined in step 700 that $$\left(\frac{U}{D}\right)_{N\pm1} = 0 \text{ dB},$$

then it can be determined in step 710 that the input signal into the tuner is equally due to signals on the adjacent channels and to signals on the desired channel. Under this determined condition, the tuner can then be switched, in step 708 to the low power mode.

If it is determined in step 712 that $$\left(\frac{U}{D}\right)_{N\pm1} > 0 \text{ dB},$$

then it can be determined in step 712 that the input signal into the tuner is mostly due to signals on the adjacent channels and not to the desired channel. Under this determined condition, the tuner can, in step 714, be controlled to remain in high power mode.

Figure 8:
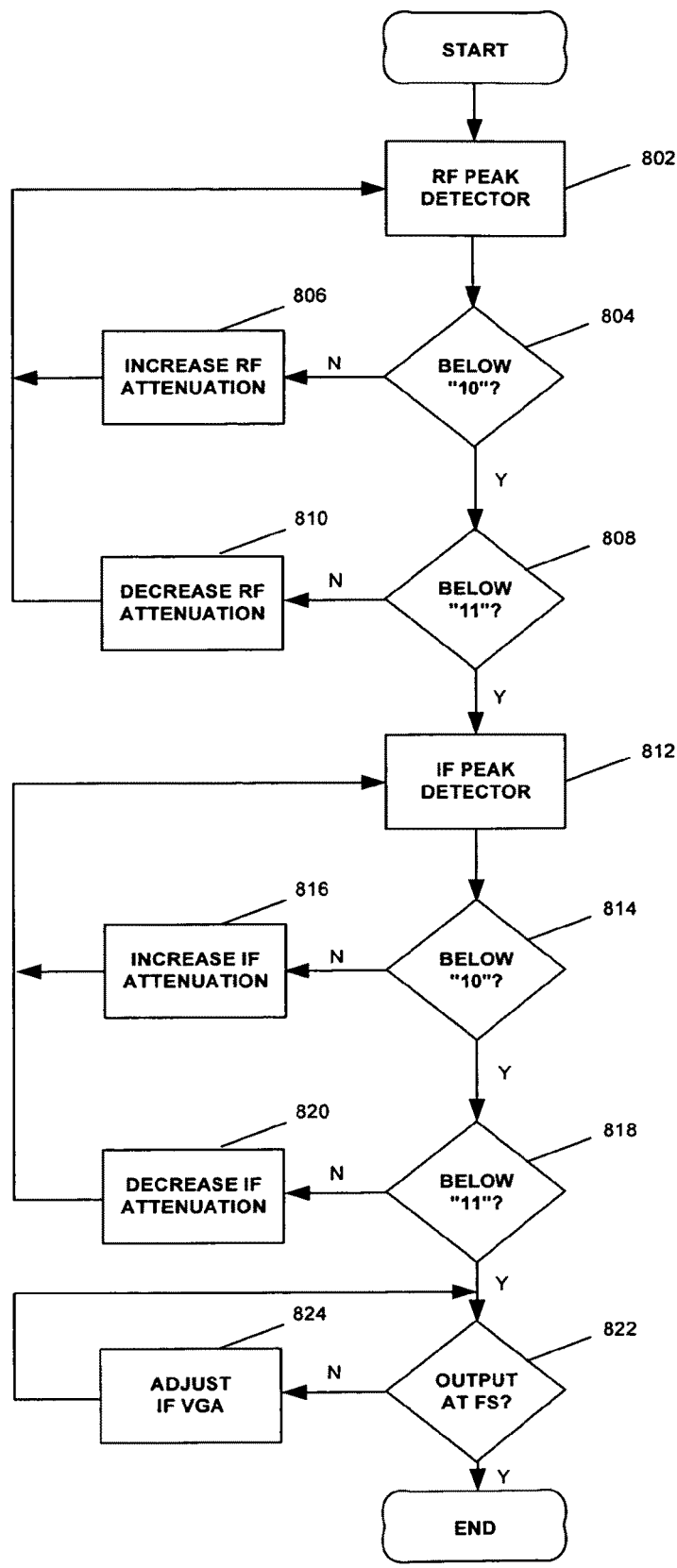
FIG. 8 is a flow chart illustrating an example method for controlling the gain of AGCs included in the tuner of FIG. 2.

FIG. 8 is a flow chart illustrating an example method for controlling the AGCs of tuner 202 in a low power mode in accordance with one embodiment of the systems and methods described herein. First, in order to adjust the AGCs, processor 204 can be configured to look, in step 802, at the measurement supplied by RF peak detector 210. If the measurement is below the value associated with "10" but above the "11" value, as determined in steps 804 and 808, then processor 204 can be configure to simply maintain the RF attenuation level as is. If the measurement from RF peak detector 208 is determined, in step 804, to be above the "10" value, however, then processor 204 can be configured to adjust RF AGC 208 so as to increase the RF attenuation in order to bring the measured power back between the "10" and "11" values, in step 806. If it is determined in step 808 that the measured RF power is below the "11" value, then processor 204 can be configured to control RF AGC 208 in order to reduce the RF attenuation and bring the measured power back between the "10" and "11" values, in step 810.

In step 812, processor 204 can be configured to check the measurement supplied by IF peak detector 220. If the measurement is below the "10" value, but above the "11" value, as determined in steps 814 and 818, then processor 204 can be configured to simply maintain the IF attenuation. But if it is determined in step 814, that the measure power is above the "10" value, then processor 204 can be configured to control IF AGC 218, in step 816, in order to bring the measured value back between the "10" and "11" values. If it is determined in step 818 that the measured power is below the "11" value, then processor 204 can be configured to control IF AGC 218, in step 820, in order to bring the measured value back between the "10" and "11" values.

Processor 204 can be configured to adjust VGA 230, in step 824, so that the signal at the output of tuner 202 is full scale after each adjustment of the AGCs as determined in step 822. Additionally, in certain embodiments, SNR detector 312 can be monitored before and after any changes in AGC settings to make sure that the desired result is obtained.

As mentioned, tuner 202 can comprise an image rejection block 222. Image rejection block can comprise a bandstop filter 224, IF mixer 226, a band stop filter 227, and band pass filter 228. Filters 224, 227, and 228 taken together behave as an equivalent bandpass filter with programmable bandwidth. For example, in one embodiment, the bandwidth of the equivalent bandpass filter included in image rejection block 222 can be controlled directly by processor 204. In other embodiments, a separate controller can be included to control the bandwidth of image rejection block 222. For example, in one implementation, bandpass filter 228 include I$^2$C control inputs in order to receive bandwidth control signals.

Providing controllable bandwidth via image rejection block 222 can improve tuner performance and allow for a global tuner design that can operate in multiple modes, i.e., operate in accordance with multiple standards. As mentioned above, a receiver 200 can be configured to operate in both digital and analog systems as well as both cable and terrestrial systems. Accordingly, tuner 200 can, for example, be configured to implement the following standards: DOCSIS, Euro-DOCSIS, DVB-C, DVB-T, ATSC, NTSC, PAL, and SECAM. Often these standards specify different channel bandwidths, which requires the tuner designer to design standard specific tuners. By incorporating programmable bandwidth, e.g., via image rejection block 222, the designer can now design a single global tuner. Further, the external filter 120, found in conventional tuners, can be eliminated, which reduces the number of components and, therefore, can help reduce the size and cost requirements associated with conventional tuners.

Figure 9:
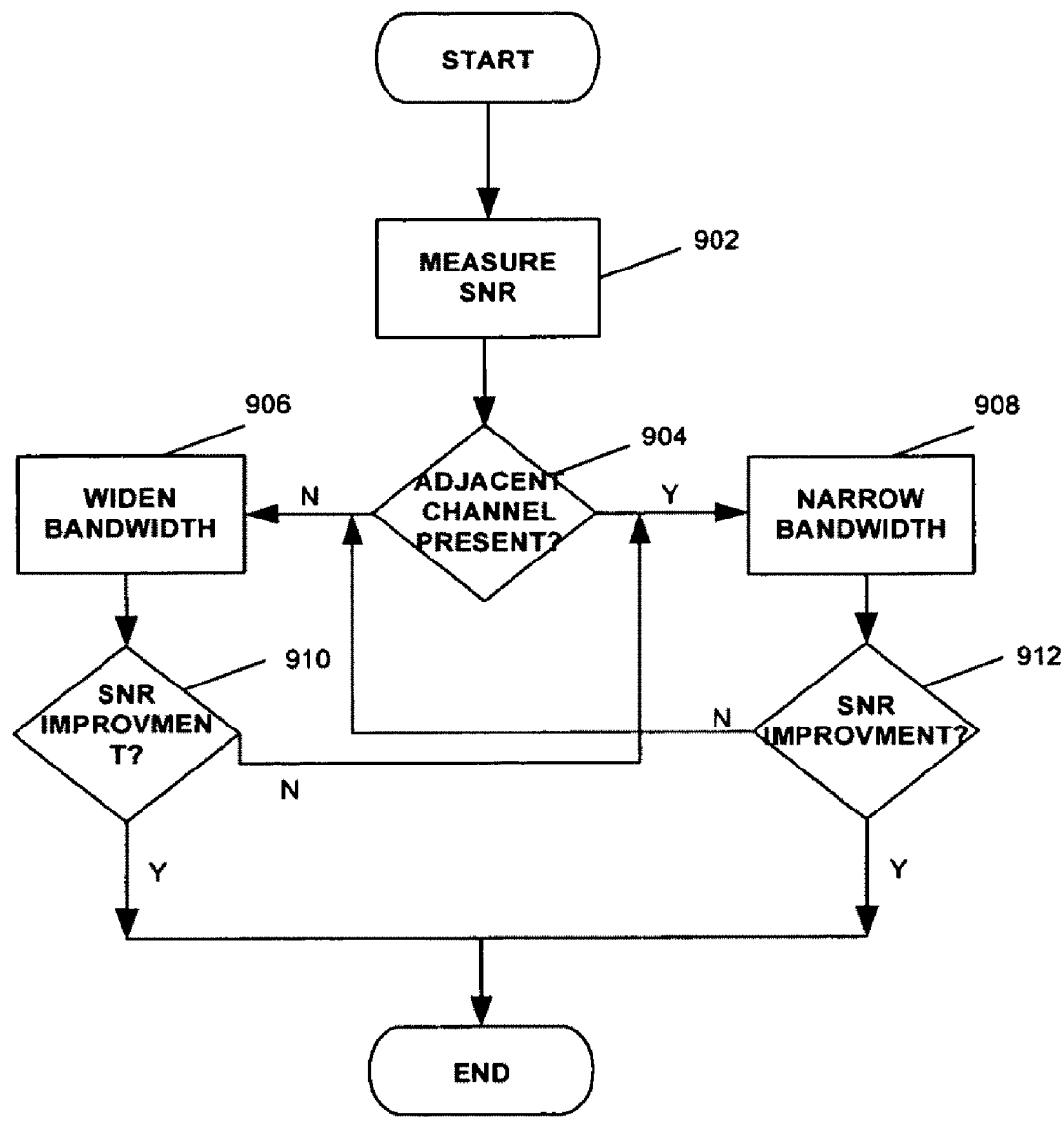
FIG. 9 is a flow chart illustrating an example method for controlling the bandwidth of a receiver included in the tuner of FIG. 2.

In addition, the bandwidth programmability provided by image rejection block 222 can be used to further optimize SNR. For example, the SNR can be monitored using SNR detector 312, and the bandwidth of image rejection block 222 can be adjusted based on this measurement. FIG. 9 is a diagram illustrating an example method for controlling the bandwidth of tuner 202 in accordance with one embodiment of the systems and methods described herein. First, in step 902, the SNR can be determined. If the SNR is deficient, then is can be determined whether the poor SNR is due to adjacent channel interference in step 904. If there is adjacent channel interference, then the linearity of tuner 202 will be effected, causing the poor SNR. In this case, the bandwidth of receiver 202 can be narrowed, in step 910, e.g., via control of image rejection block 222, in order to block the adjacent channels.

In step 912, it can be determined if the SNR is improved. If it has improved, then the process can end. If not, then the bandwidth can be widened in step 906.

If it is determined in step 904 that adjacent channels are not effecting the SNR, then it can be determined, in step 906, whether the poor SNR is due to group delay distortion. If the poor SNR is due to group delay distortion, then the bandwidth of receiver 202 can be widened in step 908 to remove the group delay distortion. In step 910, it can be determined if the SNR is improved. If it has improved, then the process can end. If not, then the bandwidth can be narrowed in step 908.

It should also be pointed out that in certain embodiments, receiver 202 can comprise a relatively wide bandwidth on chip filter 214, which allows for the use of a relatively narrow band filter 216, e.g., a narrow band SAW filter, external to receiver 202.

Figure 4:
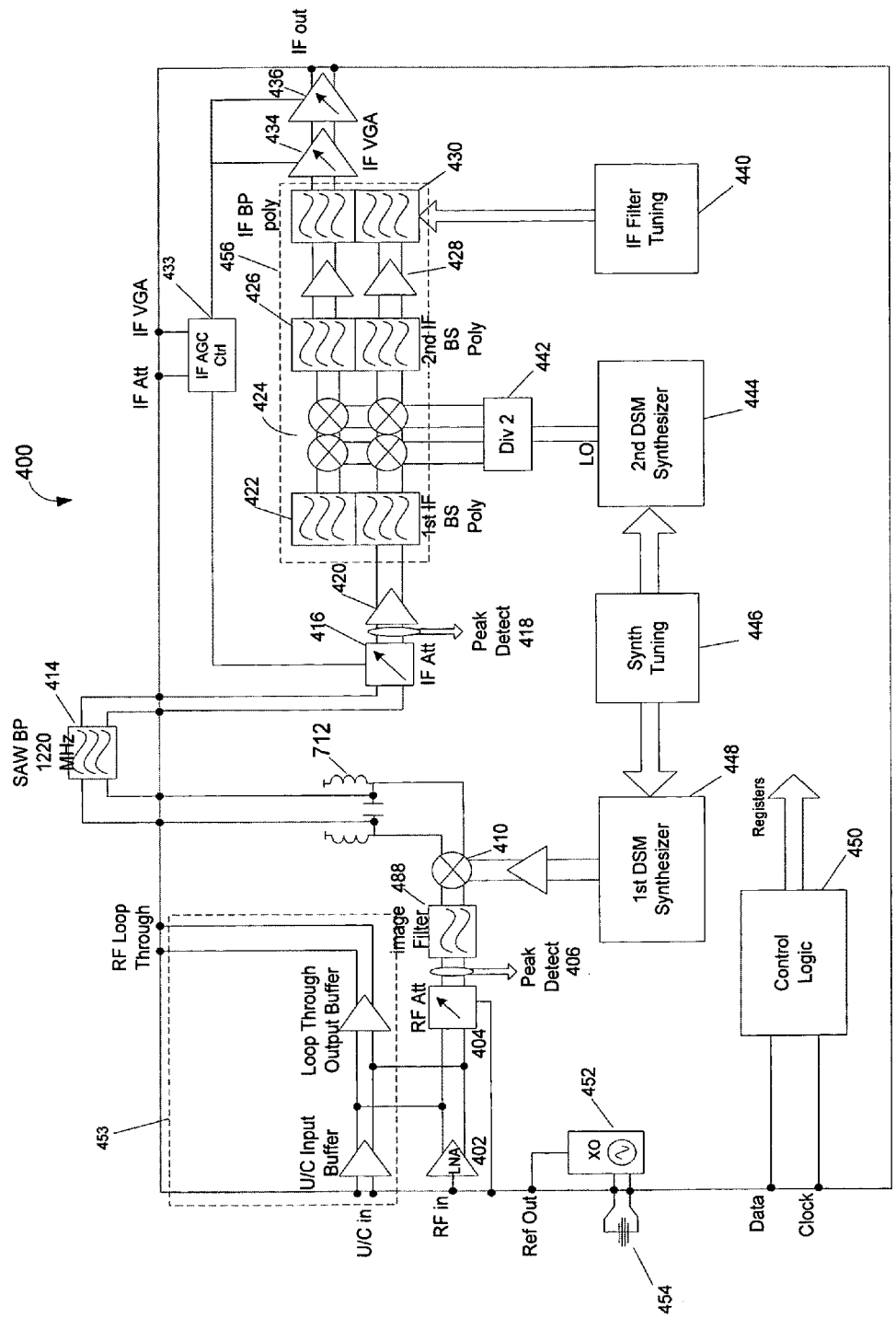
FIG. 4 is a diagram illustrating a more detailed implementation of the tuner of FIG. 2.

FIG. 4 is a more detailed diagram of a receiver 400 configured in accordance with the systems and methods described herein. As can be seen, receiver 400 comprises a RF input (RF In) on which receiver 400 receives an RF input signal. The RF signal is then amplified via LNA 402, before being passed to RF AGC 404, which is followed by RF peak detector 406. As can be seen, receiver 400 uses differential signals, but it will be clear that the systems and methods described herein can be implemented with single ended or differential signals.

After peak detector 404, the signal is filtered by image filter 408 and converted to an IF signal by mixer 410. The IF signal is then filtered by on chip filter 412 and then off chip filter 414. As mentioned, on chip filter 412 can comprise a relatively wide bandwidth, while off chip filter 414 can comprise a relatively narrow bandwidth.

The filtered IF signal can then be passed to IF AGC 416, and then IF peak detector 418. IF peak detector 418 can be followed by a buffer, or a fixed gain amplifier, 420. The signal can then be passed to an image rejection block 456. Image rejection block 456 can comprise a quadrature mixer 424 configured to convert the IF signal to a low IF signal. Image rejection block 456 can also comprise a first poly phase filter 422 and a second poly phase filter 426, as well as programmable filter 430. A pair of VGAs 434 and 436 can follow image rejection block 456 at the output of the tuner portion of receiver 400.

Receiver 400 can comprise a IF AGC control circuit 438 configured to receive control signals from a processor, or controller that can then be used to control the attenuation/gain in the IF section of tuner 400. Receiver 400 can also comprise an input (RF Att) that can be configured to receive control signals for controlling the attenuation of RF AGC 404. Receiver 400 can also comprise a IF filter tuning circuit 440 configured to control the band width of image rejection block 456.

Two synthesizers 448 and 444 can be included in receiver 400 and configured to generate the relevant RF and IF Lo signals used by mixers 410 and 424. Synthesizer tuning circuit 446 can be included and configured to tune synthesizers 448 and 444 for the appropriate channel.

It should also be pointed out that tuner 400 can include an integrate U/C block. The U/C block can be configured in the case of multi-tuner applications. For example, when the cable TV signal is split into three, first for TV, second for VCR, and third for cable modem. Then, by having an external LNA and bypassing the internal LNA, 402, via U/C block, multiple tuner can be configured. In conventional tuners, the U/C bock is external to tuner 400. Integrating U/C block 458 within tuner 400 can reduce size and cost requirements.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A method for adjusting the bandwidth of a receiver, comprising:
    determining whether a signal to noise ratio for a signal output by the receiver is within a desired operating range;
    when it is determined that the signal to noise ratio is not within a desired operating range, determining whether adjacent channel interference is present in the signal;
    narrowing the bandwidth of the receiver when it is determined that adjacent channel interference is present;
    when it is determined that adjacent channel interference is not present, determining whether there is group delay distortion; and
    increasing the bandwidth of the receiver when it is determined that the group delay distortion is present.

2. The method of claim 1, further comprising determining a mode of operation and adjusting the bandwidth of the receiver based on the determined mode of operation.

3. A tuner including a receiver and a processor coupled with the receiver, the receiver comprising:
    an image rejection block, the processor configured to:
        determine whether a signal to noise ratio for a signal output by the receiver is within a desired operating range;
        when it is determined that the signal to noise ratio is not within a desired operating range, determine whether adjacent channel interference is present in the signal;
        control the image rejection block so as to narrow the bandwidth of the receiver when it is determined that adjacent channel interference is present;
        when it is determined that adjacent channel interference is not present, determine whether there is group delay distortion; and
        control the image rejection block so as to increase the bandwidth of the receiver when it is determined that the group delay distortion is present.

4. The tuner of claim 3, wherein the image rejection block comprises a bandstop filter, a mixer, and a programmable filter and wherein the processor is configured to control the image rejection block by programming the programmable filter.

5. The tuner of claim 4, wherein the processor is further configured to determine a mode of operation and control the image rejection block in order to adjust the bandwidth of the receiver based on the determined mode of operation.

* * * * *